United States Patent
May et al.

[11] Patent Number: 6,057,713
[45] Date of Patent: May 2, 2000

[54] METHOD AND APPARATUS FOR PERFORMING VOLTAGE SAMPLING

[75] Inventors: Michael R. May; John E. Willis, both of Austin, Tex.

[73] Assignee: Motorola, Inc., Schaumburg, Ill.

[21] Appl. No.: 09/038,751

[22] Filed: Mar. 12, 1998

[51] Int. Cl.[7] .................................................. G11C 27/02
[52] U.S. Cl. ................................................. 327/93; 327/94
[58] Field of Search ................................. 327/91, 92, 93, 327/94, 96, 554; 341/122, 124, 125

[56] References Cited

U.S. PATENT DOCUMENTS

| | | | |
|---|---|---|---|
| 4,835,482 | 5/1989 | Tamakoshi et al. | 327/554 |
| 5,331,230 | 7/1994 | Ichihara | 327/94 |
| 5,424,670 | 6/1995 | Samuels et al. | 327/337 |

*Primary Examiner*—Tuan T. Lam
*Attorney, Agent, or Firm*—Susan C. Hill

[57] ABSTRACT

Method and apparatus for performing voltage sampling. The present invention addresses the problems encountered when a voltage is applied to a voltage sampling circuit (76). An additional capacitor (88) is used to store an amount of charge similar to the amount of charge needed by a primary capacitor (89) which provides an output signal to a voltage receiving circuit (74), such as a portion of a sigma-delta analog to digital converter. The additional capacitor (88) is charged while a primary capacitor (89) is discharged in a first clock phase. Then the additional capacitor (88) and the primary capacitor (89) are both coupled to the voltage to be sampled during a second clock phase.

22 Claims, 3 Drawing Sheets

METHOD AND APPARATUS FOR PERFORMING VOLTAGE SAMPLING

FIELD OF THE INVENTION

The present invention relates in general to electrical circuits, and more particularly to a method and apparatus for performing voltage sampling.

BACKGROUND OF THE INVENTION

A voltage sampling circuit may be used to sample a voltage at different points in time. However a problem arises when voltage transients are produced due to inductance of the conductor which provides the voltage to the voltage sampling circuit. These voltage transients may cause the voltage sampling circuit to incorrectly measure the voltage being provided. That is, the voltage to be measured may be different than the voltage that is provided at the input of the voltage sampling circuit due to the inductance of the conductor. The problem of voltage transients may be even more of a problem at higher sampling frequencies of the voltage sampling circuit. For example, as clock frequencies in integrated circuits increase and the sample time decreases, voltage transients will cause more of a problem in accurately sampling voltage values.

Referring to prior art FIG. 1, a portion of a sigma-delta converter integrated circuit 12 is illustrated. Note that voltage sampling circuit 16 uses two inverted, non-overlapping clocks where the active phase P1 of the first clock closes switches 34 and 35 and the active phase P2 of the second clock closes switches 30 and 31. The large external filter capacitor 22 is used to filter noise from positive bandgap reference voltage VREFP and from negative bandgap reference voltage VREFN. Filter capacitor 22 is also used to provide a low source impedance to voltage sampling circuit 16. When voltage sampling circuit 16 samples the voltages at nodes N3 and N4, a relatively large current flows through bond wires 18 and 19 as capacitors 24 and 26 initially charge. The large initial current flow will cause voltage transients across bond wires 18 and 19. If the sampling frequency of voltage sampling circuit 16 is slow enough, the voltage transients across bond wires 18 and 19 will decay before the end of the sampling period. However, if the sampling frequency is high enough so that the voltage transients do not subside to a sufficient level before the end of the sampling period, then a voltage error will be sampled at nodes N3 and N4.

DETAILED DESCRIPTION

Description of the Figures

Figure 1:
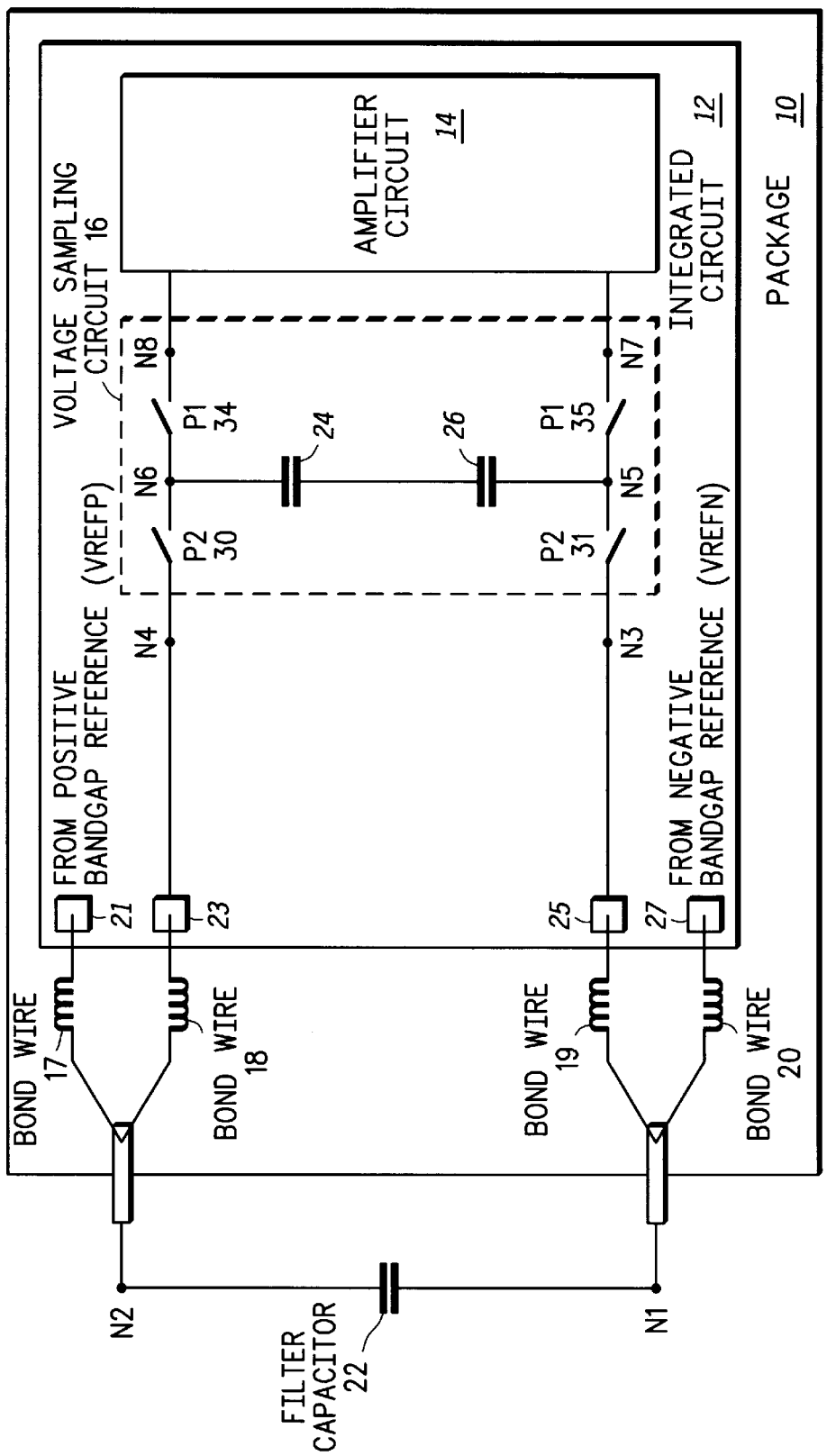
FIG. 1 illustrates, in partial block diagram form and partial schematic diagram form, a prior art circuit.

FIG. 1 is a prior art figure which illustrates an integrated circuit 12 that has been packaged in a package 10. Integrated circuit 12 is coupled external to package 10 by way of bonding pads 21, 23, 25, and 27 and bond wires 17–20. Integrated circuit 12 provides a positive bandgap reference voltage (VREFP) external to integrated circuit 12 by way of integrated circuit bonding pad 21 and bond wire 17. Similarly integrated circuit 12 provides a negative bandgap reference voltage (VREFN) external to integrated circuit 12 by way of integrated circuit pad 27 and bond wire 20. Bond wires 17 and 18 are coupled together at node N2. Bond wires 19 and 20 are coupled together at node N1.

Still referring to FIG. 1, a first current electrode of filter capacitor 22 is coupled to node N2. A second current electrode of filter capacitor 22 is coupled to node N1. Node N2 is coupled to node N4 by way of bond wire 18 and integrated circuit pad 23. Node N1 is coupled to node N3 by way of bond wire 19 and integrated circuit pad 25. Node N4 is coupled to node N6 by way of switch 30. Node N3 is coupled to node N5 by way of switch 31. Node N6 is coupled to node N8 by way of switch 34. Node N5 is coupled to node N7 by way of switch 35. A first current electrode of capacitor 24 is coupled to node N6. A second current electrode of capacitor 26 is coupled to node N5. A second current electrode of capacitor 24 is coupled to the first current electrode of capacitor 26. Capacitors 24 and 26 along with switches 30, 31, 34 and 35 make up a sampling circuit 16. Nodes N7 and N8 are each coupled to amplifier circuit 14.

Figure 2:
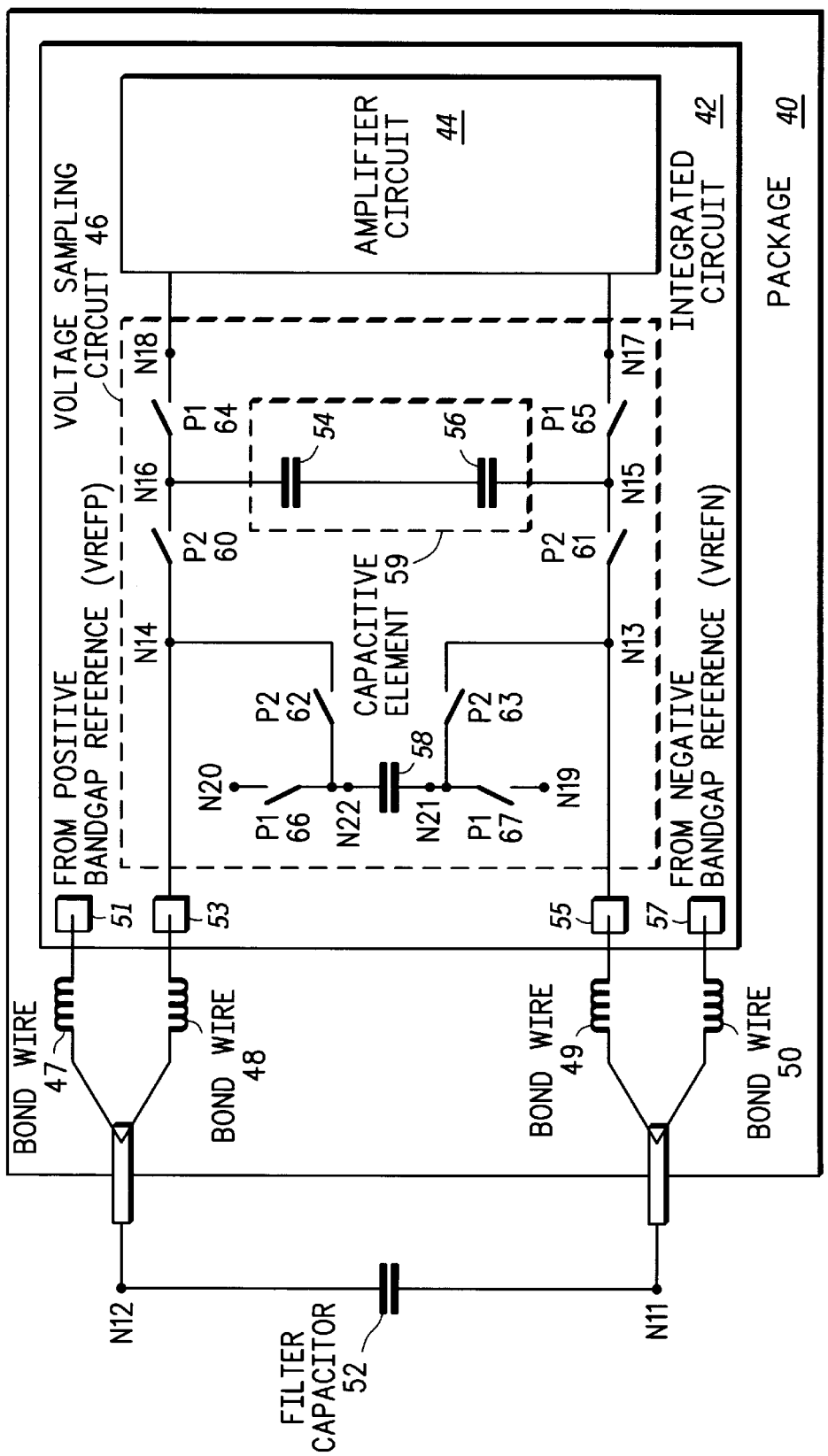
FIG. 2 illustrates, in partial block diagram form and partial schematic diagram form, a circuit in accordance with one embodiment of the present invention.

FIG. 2 illustrates a circuit in accordance with one embodiment of the present invention. FIG. 2 includes an integrated circuit 42 that has been packaged in a package 40. A positive bandgap reference (VREFP) is coupled to node N12 by way of integrated circuit pad 51 and bond wire 47. Node N12 is coupled to node N14 by way of bond wire 48 and integrated circuit pad 53. A negative bandgap reference (VREFN) is coupled to node N11 by way of integrated circuit pad 57 and bond wire 50. Node N11 is coupled to node N13 by way of bond wire 49 and integrated circuit pad 55. A first current electrode of filter capacitor 52 is coupled to node N12. A second current electrode of filter capacitor 52 is coupled to node N11. Node N14 is coupled to node N16 by way of switch 60. Node N13 is coupled to node N15 by way of switch 61. Node N16 is coupled to node N18 by way of switch 64. Node N15 is coupled to node N17 by way of switch 65.

Still referring to FIG. 2, a first current electrode of capacitor 54 is coupled to node N16. A second current electrode of capacitor 56 is coupled to node N15. A second current electrode of capacitor 54 is coupled to the first current electrode of capacitor 56. In one embodiment of the present invention capacitive element 59 includes capacitor 54 and capacitor 56. Nodes N17 and N18 are coupled to amplifier circuit 44. Node N22 is coupled to node N14 by way of switch 62. Node N21 is couple to node N13 by way of switch 63. A first current electrode of capacitor 58 is coupled to node N22. A second current electrode of capacitor 58 is coupled to N21. Node N22 is coupled to node N20 by way of switch 66. Node N21 is coupled to node N19 by way of switch 67. In one embodiment of the present invention voltage sampling circuit 46 includes capacitors 54, 56, and 58 along with switches 60–67.

Figure 3:
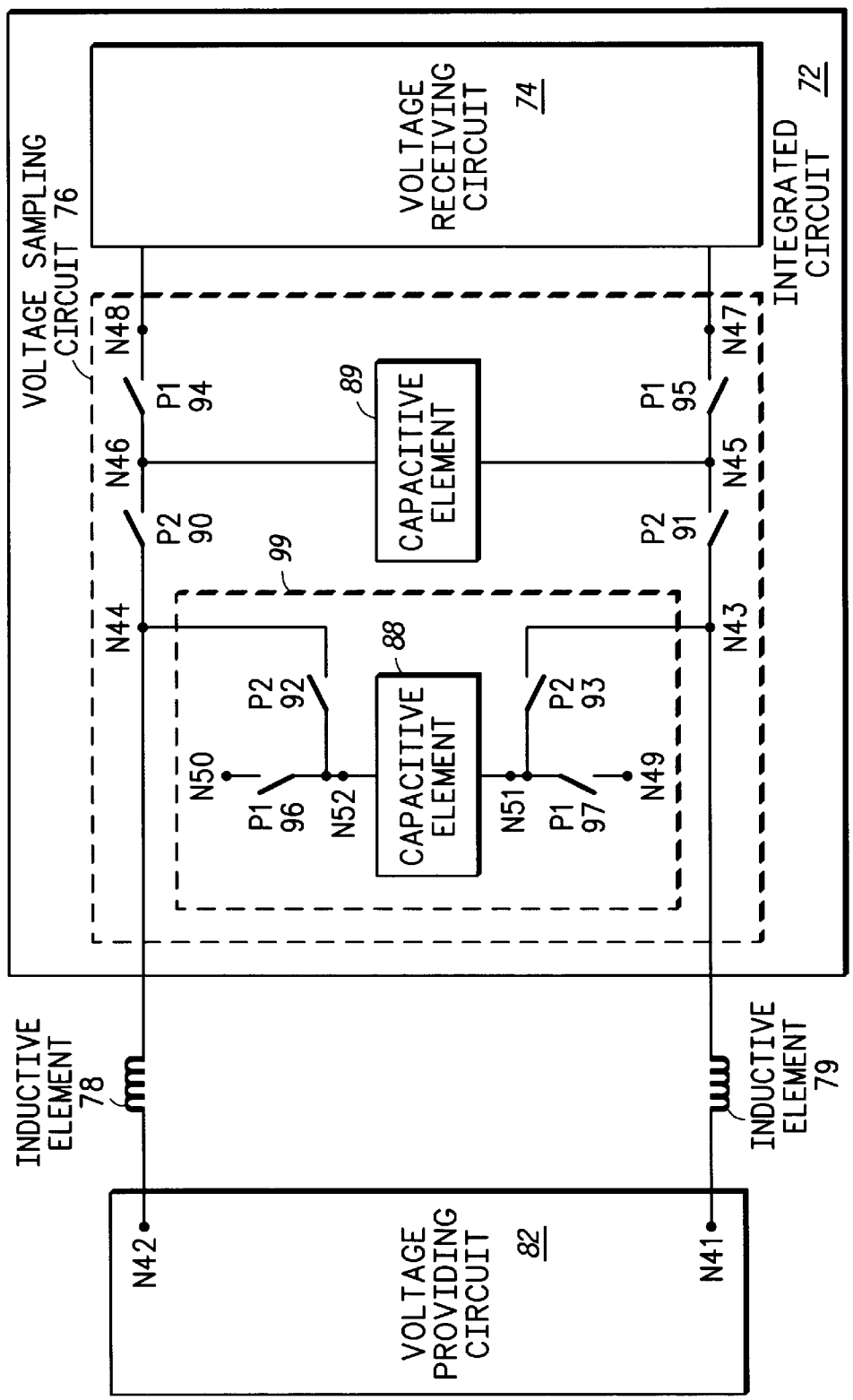
FIG. 3 illustrates, in partial block diagram form and partial schematic diagram form, a circuit in accordance with an alternate embodiment of the present invention.

FIG. 3 illustrates an integrated circuit 72 and a voltage providing circuit 82 in accordance with one embodiment of the present invention. Node N42 in voltage providing circuit 82 is coupled to node N44 in integrated circuit 72 by way of inductive element 78. Node 41 in voltage providing circuit 82 is coupled to node N43 in integrated circuit 72 by way of inductive element 79. Node N44 is coupled to node N46 by way of switch 90. Node N43 is coupled to node N45 by way of switch 91. Node N46 is coupled to node N48 by way of switch 94. Node N45 is coupled to node N47 by way of switch 95. A first current electrode of capacitive element 89 is coupled to node N46. A second current electrode of capacitive element 89 is coupled to node N45. Node N52 is coupled to node N44 by way of switch 92. Node N51 is coupled to node N43 by way of switch 93. Node N52 is coupled to node N50 by way of switch 96. Node N51 is coupled to node N49 by way of switch 97. A first current electrode of capacitive element 88 is coupled to node N52. A second current electrode of capacitive element 88 is coupled to node N51. In one embodiment of the present invention voltage sampling circuit 76 includes capacitive elements 88 and 89 as well as switches 90–97. Nodes N47 and N48 are coupled to voltage receiving circuit 74.

Description of Operation

The operation of the illustrated embodiments of the present invention will now be discussed. FIG. 2 illustrates a circuit in accordance with one embodiment of the present invention. Voltage sampling circuit 46 has been improved over the voltage sampling circuit 16 illustrated in FIG. 1 in order to reduce the voltage transients that are actually sampled at the input nodes N13 and N14 of the voltage sampling circuit 46. Voltage sampling circuit 46 reduces the voltage transients at nodes N13 and N14 by reducing the voltage transients through bond wires 48 and 49. Voltage sampling circuit 46 reduces the transients through bond wires 48 and 49 by minimizing the change in current (di/dt) that is conducted through bond wires 48 and 49 when capacitive element 59 is charged.

The initial current provided to capacitive element 59 is supplied by way of capacitor 58 through switches 62 and 63. In the embodiment of the present invention illustrated in FIG. 2, capacitor 58 is charged during the P1 clock phase by the voltage differential between node N19 and node N20. Alternate embodiments of the present invention may use any method or any charge supplying device to deliver charge to capacitor 58. Note that in one embodiment of the present invention node N19 may be at a first power supply voltage that is approximately ground and node N20 may be at a second power supply voltage that is approximately the power supply used to power all or a portion of integrated circuit 42. Alternate embodiments of the present invention may use different voltage differentials between node N19 and node N20. As capacitor 58 is used to initially charge capacitive element 59, the current that flows through bond wires 48 and 49 is only that incremental current needed to charge capacitive element 59 to its final and correct value. As a result the change in current (di/dt) which must be provided through bond wires 48 and 49 during the P2 clock phase is significantly reduced in the circuit illustrated in FIG. 2 compared to the circuit illustrated in FIG. 1 (prior art).

Still referring to FIG. 2, during clock phase P1, capacitor 58 is charged to the voltage differential between nodes N19 and N20, which in one embodiment of the present invention is equal to the power supply voltage. While capacitor 58 is being charged, capacitive element 59 is being discharged by amplifier circuit 44. During clock phase P2, capacitor 58 is coupled to nodes N13 and N14 at the same time that capacitive element 59 is also coupled to nodes N13 and N14. The fully discharged capacitive element 59 receives its initial charge from capacitor 58. The remaining charge required to accurately charge capacitive element 59 is supplied through bond wires 48 and 49. As a result, the reference voltage transients through bond wires 48 and 49 are reduced since the initial large charge was transferred from capacitor 58 rather than from filter capacitor 52 by way of bond wires 48 and 49. Thus in the circuit illustrated in FIG. 2, a large change in current never occurs through a high inductance conductor (e.g. bond wires 48 and 49), thus large voltage transients are not produced at the inputs to voltage sampling circuit 46 during the sampling clock phase P2. As a result, the accuracy of voltage sampling circuit 46 may be significantly improved over the accuracy of prior art voltage sampling circuit 16 (see FIG. 1).

Note that the large external filter capacitor 52, like capacitor 22 in FIG. 1, is used to filter noise from positive bandgap reference voltage VREFP and from negative bandgap reference voltage VREFN. Filter capacitor 52 is also used to provide a low source impedance to voltage sampling circuit 46. Although filter capacitor 52 is generally not located on integrated circuit 72 due to the large capacitive value (e.g. approximately 1 microfarad), alternate embodiments of the present invention may locate filter capacitor 52 on integrated circuit 72.

Note that for some embodiments of the present invention, shorting integrated circuit bonding pad 51 directly to integrated circuit bonding pad 53 and removing bond wire 47 will not improve the performance of voltage sampling circuit 46 because large voltage transients will still be produced through bond wire 48. For the same reason, shorting integrated circuit bonding pad 57 to integrated circuit bonding pad 55 and removing bond wire 50 will not improve the performance of voltage sampling circuit 46. This lack of improvement for some embodiments is based on the assumption that the circuitry used to provide the positive bandgap reference voltage (VREFP) and the negative bandgap reference voltage (VREFN) is a high impedance circuit compared to the impedance of filter capacitor 52.

Note that switches 60–67 in FIG. 2 have been illustrated as switches. However, in alternative embodiments of the present invention these switches may be implemented in a variety of ways, such as transmission gates using transistors, single pass transistors, or any other type of electrical switch element. In the embodiment of the present invention illustrated in FIG. 2, it is assumed that clock phase P1 and clock phase P2 are provided by two non-overlapping inverted clocks where the active phase of P1 and P2 are inverted and are never active at the same time. The provision and use of inverted, non-overlapping clocks in a switching network is well known in the art. As an example, if switch 60 in FIG. 2 is implemented as a transmission gate, the active state P1 of the first clock signal will be provided to the non-inverting control input of the transmission gate and the non-active state P1* of the first clock signal will be provided to the inverting control input of this transmission gate. The first conducting terminal of this transmission gate will be coupled to node N14, and the second conducting terminal of this transmission gate will be coupled to node N16. Note that the clock generator circuit (not shown) used to generate the first and second clocks may be located any where on integrated circuit 42, and may alternately be located external to integrated circuit 42.

Also note that alternative embodiments of the present invention may use any variety of switching schemes to couple and decouple capacitive element 59 and capacitor 58 from nodes N13 and N14 and nodes N17 and N18. For example, in one embodiment a bilinear parasitic-insensitive switching scheme may be use to selectively couple and decouple capacitor 54 to nodes N14 and N18 and capacitor 56 to nodes N13 and N17 by way of transmission gates. If transmission gates are used for switches 60–67, a bilinear parasitic-insensitive switching scheme may be particularly useful to handle the nonlinear parasitics that are caused by the transmission gates. Specifically, switches 60, 61, 64, 65 along with capacitors 54 and 56 may be replaced in an alternative embodiment by a bilinear parasitic-insensitive switching scheme using 1 to N capacitors. Again although the embodiment of the present invention illustrated in FIG. 2 shows two capacitors within capacitive element 59, alternative embodiments of the present invention may use 1 to N capacitors within capacitive element 59. Alternative embodiments of the present invention may also use any type of switching scheme to substitute for switches 60, 61, 64 and 65.

Still referring to FIG. 2 although capacitive element 58 has been illustrated as a single capacitor, alternative embodiments of the present invention may use any type of array of capacitors and switches in order to provide charge across nodes N13 and N14. For example, capacitor 58 may instead be one or more capacitors coupled in series or parallel or both. In addition a wide variety of switching schemes may be used to couple and decouple capacitor 58 or its equivalent between nodes N13 and N14. Note that alternative embodiments of the present invention may provide charge to capacitor 58 or its equivalent by way of a variety of schemes, including schemes that use additional circuit elements such as resistors, transistors and capacitors. What is important is that there must be a way to charge capacitor 58 and a way to provide that charge on capacitor 58 to nodes N13 and N14 at the appropriate time to charge capacitive element 59 such that voltage transients through bond wires 48 and 49 are significantly reduced.

In one embodiment of the present invention integrated circuit 42 includes a sigma-delta converter. Amplifier circuit 44 may thus be an operational amplifier circuit which utilizes nodes N17 and N18 as inputs to amplifier circuit 44. In this embodiment, amplifier circuit 44 drives nodes N17 and N18 to approximately the same voltage which may be considered a virtual ground. Capacitive element 59 is then discharged into the amplifier circuit 44 inputs during the clock phase P1. In alternate embodiments of the present invention, integrated circuit 42 may be any type of integrated circuit that utilizes a voltage sampling circuit.

Referring now to FIG. 3, FIG. 3 illustrates an integrated circuit 72 and a voltage providing circuit 82 in accordance with one embodiment of the present invention. The operating principles of the voltage sampling circuit 76 illustrated in FIG. 3 are similar to the operating principles of voltage sampling circuit 46 illustrated in FIG. 2. Inductive element 78 represents inductance of the conductor coupled between nodes N42 and N44. Inductive element 79 represents the inductance of the inductor coupled between nodes N41 and N43. Nodes N42 and N44 and nodes N41 and N43 may be coupled in a variety of ways including integrated circuit bond wires. However, what is important is that inductive elements 78 and 79 cause voltage transients to be provided at nodes N44 and N43 respectively.

Referring to FIG. 3, voltage providing circuit 82 may be providing a time varying voltage across nodes N41 and N42. This is different from the circuit illustrated in FIG. 2. In the circuit illustrated in FIG. 2 a constant voltage was provided at nodes N11 and N12 by way of positive bandgap reference voltage VREFP and negative bandgap reference voltage VREFN. Referring to FIG. 3, if the voltages provided at nodes N41 and N42 are variable, then the charge provided by circuit 99 must be variable as well. In fact the voltage at node 50 must be a linear function of the voltage at N44 and the voltage provided at node N49 must be a linear function of the voltage at node N43 to maintain efficient reduction of bond wire voltage transients. The voltage at node N44 tracks the voltage at node N42 plus any voltage transients due to inductive element 78. Similarly the voltage at node N43 tracks the voltage at N41 plus any transients due to inductive element 79. A charge supplying device of any type (e.g. a power supply, any type of current source, any type of voltage source, etc.) is coupled to nodes N49 and N50 in an appropriate manner in order to supply charge to capacitive element 88. The charge is selectively provided from the charge supplying device to capacitive element 88 by way of nodes N49 and N50 during the P1 clock phase.

As an example the voltage at node N50 may be twice the variable voltage at node N44. Similarly the voltage at node N49 may be twice the variable voltage provided at node N43. Capacitive element 88 may have an equivalent capacitance of 0.25 picofarads and capacitive element 89 may have an equivalent capacitance of 0.25 picofarads. As a result, capacitive element 88 may provide approximately all the charge required by capacitive element 89 with a small amount of charge needing to be provided by voltage providing circuit 82 by way of inductive elements 78 and 79. As a result, the change in current through inductive element 78 and 79 is significantly reduced and the voltage transients produced by inductive elements 78 and 79 are likewise similarly reduced. Consequently, voltage sampling circuit 76 is able to more accurately sample the voltage provided at nodes N43 and N44.

As a second example, node N50 may be directly connected to node N44 and node N49 may be directly connected to node N43. Thus, the voltage at node N49 will be equal to the voltage provided at node N43 and the voltage at node N50 will be equal to the voltage provided at node N44. A network within capacitive element 88 may include N capacitors and a plurality of switches. The switches may configure the N capacitors in a parallel configuration during the clock phase P1 in which the N capacitors are charged, and may configure the N capacitors in a series configuration during the clock phase P2 in which the N capacitors are discharged into capacitive element 89.

Although FIG. 2 and FIG. 3 have been described in terms of sampling of voltage differential between two predetermined nodes, alternative embodiments of the present invention may sample a voltage between two predetermined nodes in which one of the nodes is approximately ground. Thus a differential voltage is no longer being sampled but a single-ended voltage is being sampled. For example, referring to FIG. 2, if the voltage at node N11 is approximately ground and it is desired to sample the voltage at node N12 then node N11 will be coupled to ground by way of inductor 50 and integrated circuit pad 57. Inductor 49 and integrated circuit pad 55 may be removed. Nodes N13, N15, N17 and N21 may all be coupled together to approximately ground and switches 61, 63, 65 and 67 may be removed. Similarly a single-ended implementation of FIG. 3 may be produced by removing switches 91, 93, 95 and 97 and by coupling all of nodes N43, N45, N47, N49 and N51 to approximately ground.

Note that the circuits illustrated in FIGS. 2 and 3 may be used as part of a sigma-delta converter. The sigma-delta converter may be either an analog to digital converter or a digital to analog converter. In addition the integrated circuits 42, 72 illustrated in FIGS. 2 and 3 may be used as part of an ADSL (Asymmetric Digital Subscriber Loop) communication system or any other communication system. However, alternate embodiments of the present invention may use voltage sampling circuits 46, 76 in a wide variety of applications (e.g. control systems) and are not limited to communication applications.

While the present invention has been illustrated and described with reference to specific embodiments, further modifications and improvements will occur to those skilled in the art. It is to be understood, therefore, that this invention is not limited to the particular forms illustrated and that the appended claims cover all modifications that do not depart from the scope of this invention.

What is claimed is:

1. A voltage sampling circuit comprising
an inductive element coupled to a first input, the first input for receiving a first voltage to be sampled, a second input for applying a charge supplying element, a third input for providing a first and a second clock phase, a first capacitive element and a second capacitive element, an output for outputting the sampled first voltage,
wherein during the first clock phase the first capacitive element is coupled to the second input and the second capacitive element is coupled to the output,
wherein during the second clock phase the first capacitive element is coupled to the first input and the second capacitive element is coupled to the first input;
and wherein the second input is coupled to supply a first amount of charge to the first capacitive element, so that during the second clock phase a second amount of charge supplied from the first input to the first and second capacitive elements is minimized in order to reduce current through the inductive element.

2. The voltage sampling circuit according to claim 1 wherein the charge supplying element is a voltage reference having a second voltage, wherein a relationship between the first voltage and the second voltage is predetermined.

3. The voltage sampling circuit according to claim 2 wherein the first voltage is less than the second voltage.

4. The voltage sampling circuit according to claim 1 wherein the inductive element is external to an integrated circuit die.

5. The voltage sampling circuit according to claim 4 wherein the second input is connected to the first input.

6. The voltage sampling circuit according to claim 1 wherein the inductive element is a bond wire.

7. The voltage sampling circuit according to claim 6 wherein the first amount of charge is substantially equal to a product of the first voltage and a capacitive value of the first and second capacitive elements.

8. The voltage sampling circuit according to claim 1 wherein the first and the second clock phases are provided by a first and a second clock signal, the first and the second clock signal being inverted and non-overlapping with respect to each other.

9. The voltage sampling circuit according to claim 1 wherein the first capacitive element is coupled to the second capacitive element in parallel during the second clock phase.

10. The voltage sampling circuit according to claim 1 being implemented on an integrated circuit.

11. An integrated circuit comprising
a first input for receiving a first voltage from an inductive element external to the integrated circuit die, the first input applying said first voltage to be sampled, a charge supplying element, a clock provider for providing a first and a second clock phase, a first capacitive element and a second capacitive element, and a voltage receiving circuit for receiving the sampled first voltage,
wherein during the first clock phase the first capacitive element is coupled to the charge supplying element and the second capacitive element is coupled to the voltage receiving circuit,
wherein during the second clock phase the second capacitive element is coupled to the first input and the first capacitive element is coupled to the first input to reduce the current through the inductive element.

12. The integrated circuit according to claim 11 wherein the voltage receiving circuit is a portion of a sigma-delta analog to digital converter.

13. The integrated circuit according to claim 11 wherein the voltage receiving circuit is a portion of a sigma-delta digital to analog converter.

14. A communication device comprising a voltage providing circuit and an integrated circuit,
the integrated circuit comprising a first input being coupled to the voltage providing circuit by way of an inductive element, a charge supplying element, a clock provider for providing a first and a second clock phase, a first capacitive element and a second capacitive element, and a voltage receiving circuit for receiving a sampled first voltage from said integrated circuit,
wherein during the first clock phase the first capacitive element is coupled to the charge supplying element and the second capacitive element is coupled to the voltage receiving circuit,
wherein during the second clock phase the second capacitive element is coupled to the first input and the first capacitive element is coupled to the first input to reduce current through the inductive element.

15. The communication device of claim 14 wherein the inductive element is a bond wire.

16. The communication device of claim 14 wherein the voltage providing circuit is a bandgap reference circuit.

17. The communication device of claim 14 wherein the voltage receiving circuit is a portion of a sigma-delta digital to analog converter.

18. The communication device of claim 14 wherein the voltage receiving circuit is a portion of a sigma-delta analog to digital converter.

19. The communication device of claim 14 being of a digital subscriber loop type.

20. A method for sampling a first voltage comprising the steps of:
during a first phase charging a first capacitive element with a first amount of charge and discharging a second capacitive element, the first amount of charge being representative of the first voltage,
during a second phase coupling the first and second capacitive elements to the first voltage, such that a second amount of charge across the first and second capacitive elements is substantially equal to the first amount of charge so that a current drawn through an inductive element is reduced.

21. The method for sampling according to claim 20 wherein the first amount of charge is substantially equal to a product of the first voltage and a capacitive value of the first and second capacitive elements.

22. The method for sampling according to claim 20 whereby during the second phase a second amount of charge is supplied to the first and second capacitive elements, the second amount of charge being provided by a voltage reference circuit.

* * * * *